(12) United States Patent
Ishiguro et al.

(10) Patent No.: US 8,497,419 B2
(45) Date of Patent: Jul. 30, 2013

(54) SOLAR CELL MODULE

(75) Inventors: Tasuku Ishiguro, Kobe (JP); Eiji Maruyama, Katano (JP)

(73) Assignee: Sanyo Electric Co., Ltd., Moriguchi-shi (JP)

(*) Notice: Subject to any disclaimer, the term of this patent is extended or adjusted under 35 U.S.C. 154(b) by 0 days.

(21) Appl. No.: 13/278,282

(22) Filed: Oct. 21, 2011

(65) Prior Publication Data
US 2012/0080069 A1 Apr. 5, 2012

Related U.S. Application Data

(63) Continuation of application No. PCT/JP2010/055548, filed on Mar. 29, 2010.

(30) Foreign Application Priority Data

Apr. 21, 2009 (JP) .................. 2009-103160

(51) Int. Cl.
*H02N 6/00* (2006.01)
*H01L 31/00* (2006.01)

(52) U.S. Cl.
USPC .......................... 136/244; 136/256

(58) Field of Classification Search
USPC .................................. 136/244, 256
See application file for complete search history.

(56) References Cited

U.S. PATENT DOCUMENTS

2007/0186968 A1* 8/2007 Nakauchi et al. ............. 136/244
2007/0235077 A1   10/2007 Nagata et al.
2009/0288697 A1   11/2009 Shimizu et al.

FOREIGN PATENT DOCUMENTS

JP   2007-214533 A   8/2007
JP   2008-053681 A   3/2008

* cited by examiner

*Primary Examiner* — Jonathan Johnson
*Assistant Examiner* — Angelo Trivisonno
(74) *Attorney, Agent, or Firm* — Marvin A. Motsenbocker; Mots Law, PLLC

(57) ABSTRACT

Provided is a solar cell module (100) wherein an adhesive (30) has a first adhesive portion (30A) which is formed from the light receiving surface of a solar cell (10) to the side surface (20S) of a wiring material (20).

7 Claims, 9 Drawing Sheets

SOLAR CELL MODULE

CROSS REFERENCE

This application is a Continuation of PCT Application No. PCT/JP2010/055548 filed on Mar. 29, 2010, and claims the priority of Japanese Patent Application No. 2009-103160 filed on Apr. 21, 2009, the content of both of which is incorporated herein by reference

TECHNICAL FIELD

The present invention relates to a solar cell connected with a wiring member and relates to a solar cell module provided with the solar cell.

BACKGROUND ART

A solar cell is expected as a new energy source because it can directly convert light from the sun, which is clean and inexhaustible sunlight energy, into electricity.

Output per solar cell is as small as several W. Accordingly, when used for a power source of houses or buildings, such solar cells are generally used as a solar cell module in which the output is increased by electrically connecting a plurality of solar cells by means of a wiring member.

Generally, a solar cell is provided with a plurality of thin line electrodes for collecting carriers and a connecting electrode for connecting a wiring member. The wiring member is soldered on the connecting electrode. The thin line electrode and the connecting electrode are formed from a thermosetting or sintering conductive paste.

Here, a technique to let a wiring member adhere to a connecting electrode using a resin adhesive which is capable of adhering at a temperature lower than soldering is proposed (see patent literature 1).

According to this technique, since expansion and contraction of the wiring member during the connection can be reduced, bending of a solar cell can be suppressed.

CITATION LIST

Patent Literature

Patent Literature 1: Japanese Patent Application Publication No. 2007-214533

SUMMARY OF THE INVENTION

However, a wiring member repeats expansion and contraction also in a normal usage environment of a solar cell module. For this reason, since expansion and contraction of the wiring member lowers the adhesion between the wiring member and the solar cell, connection resistance between the wiring member and the solar cell increases. As a result, there has been a possibility that the characteristics of the solar cell is degraded.

The present invention is made in view of the above-described circumstances and an object thereof is to provide a solar cell module of which degradation in characteristics can be suppressed.

A feature of the present invention is summarized as a solar cell module which includes a solar cell and a wiring member connected to a main surface of the solar cell by an adhesive, wherein the adhesive includes a first adhesive portion formed from the main surface to a side surface of the wiring member.

In the solar cell according to the feature of the present invention, the adhesive may include a plurality of first adhesive portions each formed from the main surface to the side surface, the plurality of the first adhesive portions including the first adhesive portion; and the plurality of first adhesive portions may be distributed along a longitudinal direction of the wiring member.

In the solar cell according to the feature of the present invention, the adhesive may include a second adhesive portion provided between the solar cell and the wiring member.

In the solar cell according to the feature of the present invention, the first portion and the second portion may be formed integrally with one another.

In the solar cell according to the feature of the present invention, the solar cell may include, near the wiring member on the main surface, a pooling portion which pools the first adhesive portion.

In the solar cell according to the feature of the present invention, the solar cell may include a plurality of pooling portions each of which pool the adhesive near the wiring member on the main surface, and the pooling portion is included in the plurality of pooling portions; and the plurality of pooling portions are distributed along the longitudinal direction of the wiring member.

In the solar cell module according to the feature of the present invention, the solar cell may include an electrode formed on the main surface, and the pooling portion may be formed by the electrode.

In the solar cell module according to the feature of the present invention, the electrode may include a plurality of thin line electrodes which are formed on the main surface along a direction perpendicular to the longitudinal direction and are arranged in parallel along the longitudinal direction, and a cross electrode which crosses at least one thin line electrode among the plurality of thin line electrode, and the pooling portion may be formed at least by the cross electrode.

In the solar cell module according to the feature of the present invention, the pooling portion may correspond to a portion surrounded by the cross electrode and the wiring member on the main surface.

In the solar cell module according to the feature of the present invention, the height of the cross electrode may be greater than the height of a thin line electrode which crosses the cross electrode among the plurality of thin line electrodes.

In the solar cell module according to the feature of the present invention, the cross electrode may include a covered portion which is covered with the wiring member when seen in a plan view of the main surface and an exposed portion which is exposed from the wiring member when seen in a plan view of the main surface, and the height of the covered portion may be lower than the height of the exposed portion.

In the solar cell module according to the feature of the present invention, the cross electrode may include a crossing portion which crosses one thin line electrode among the plurality of thin line electrodes and an extending portion extending from the crossing portion, and the line width of the crossing portion may be greater than the line width of the extending portion.

In the solar cell module according to the feature of the present invention, the electrode may include a plurality of cross electrodes each of which crosses at least one thin line electrode among the plurality of thin line electrodes and the plurality of cross electrodes include the cross electrode, and each of the plurality of cross electrodes may be provided along the longitudinal direction.

In the solar cell module according to the feature of the present invention, the line width of the cross electrode may be greater than the line width of the thin line electrode which crosses the cross electrode among the plurality of thin line electrodes.

In the solar cell module according to the feature of the present invention, the adhesive may be a resin adhesive.

In the solar cell module according to the feature of the present invention, the adhesive may include resin and a conductive material, and the height of the first adhesive portion may be greater than the height of the conductive material.

In the solar cell module according to the feature of the present invention, the adhesive may include resin and a conductive material, and the resin may extend over the main surface and the side surface.

A feature of the present invention is summarized as a solar cell module including: a solar cell; a plurality of thin line electrodes arranged at predetermined intervals on a main surface of the solar cell; a wiring member arranged along an arrangement direction of the plurality of thin line electrodes; and an adhesive which adhere the wiring member on the main surface, wherein: the solar cell module includes a cross electrode formed in a zigzag shape along the arrangement direction; the cross electrode includes an exposed portion which is exposed from the wiring member; the adhesive lets a side surface of the wiring member adhere to the main surface; and the adhesive is formed in a region surrounded by the cross electrode and the wiring member when seen in a plan view.

In the solar cell module according to the feature of the present invention, the adhesive may be a resin adhesive.

In the solar cell module according to the feature of the present invention, the adhesive may include resin and a conductive material.

In the solar cell module according to the feature of the present invention, the height of a portion of the adhesive which lets the side surface adhere to the main surface may be greater than the height of the conductive material.

According to the present invention, a solar cell module which can suppress degradation in characteristics can be provided.

BEST MODES FOR CARRYING OUT THE INVENTION

Figure 1:
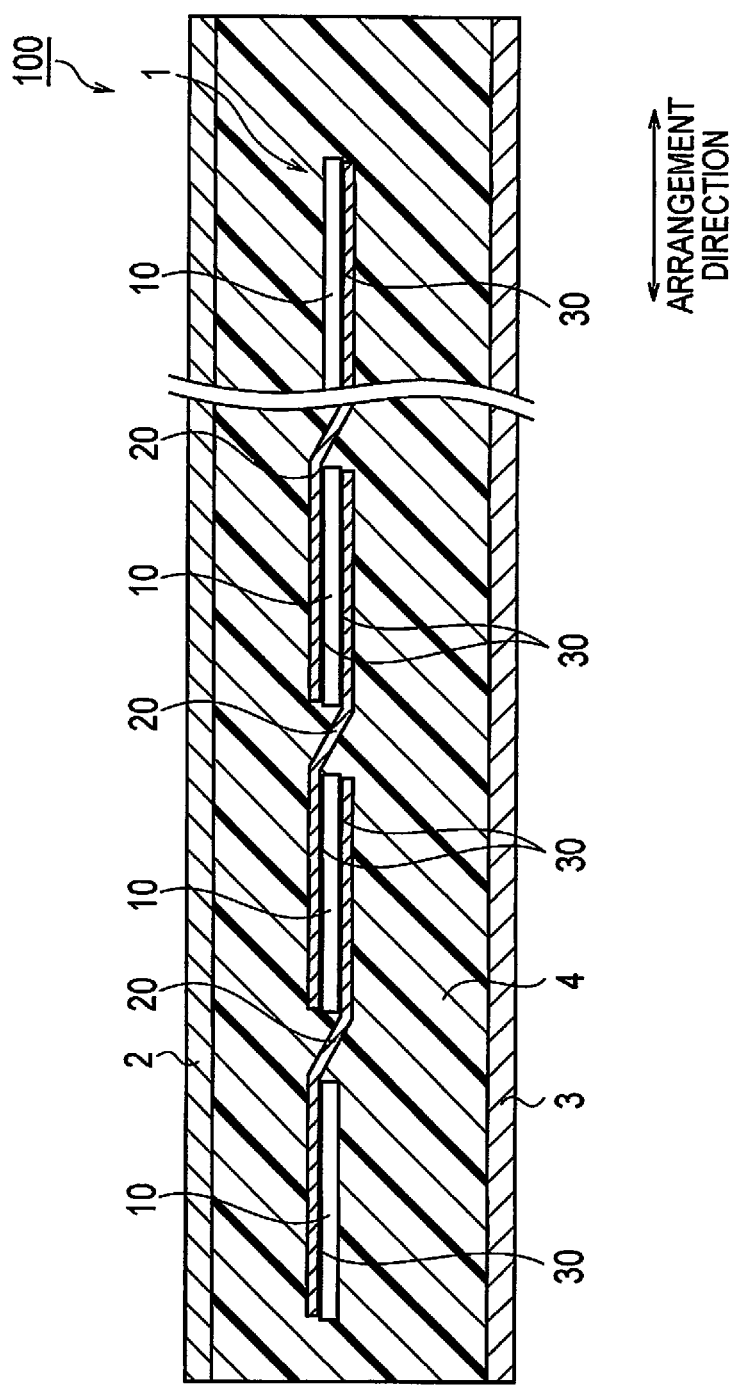
FIG. 1 is a side view of a solar cell module 100 according to a first embodiment of the present invention.

Next, embodiments of the present invention will be described with reference to the drawings. In the following description of the drawings, the same or similar parts are denoted by the same or similar reference numerals. It should be noted that the drawings are schematic, and dimensional proportions and the like are different from their actual value. Accordingly, specific dimension and the like should be determined with reference to the following description. In addition, it is a matter of course that dimensional relationships and dimensional proportions may be different from one drawing to another in some parts.

[First Embodiment]
(Schematic Structure of Solar Cell Module)

A schematic structure of a solar cell module 100 according to the embodiment will be described with reference to FIG. 1. FIG. 1 is a side view of the solar cell module 100 according to the present embodiment.

The solar cell module 100 is provided with a solar cell string 1, a light-receiving-surface-side protection member 2, a back-surface-side protection member 3 and a sealing material 4. The solar cell module 100 is constituted by sealing the solar cell string 1 between the light-receiving-surface-side protection member 2 and the back-surface-side protection member 3.

The solar cell string 1 is provided with a plurality of solar cells 10, a wiring member 20 and an adhesive 30. The structure of the solar cell string 1 will be described later.

A plurality of solar cells 10 are arranged along an arrangement direction. Each of a plurality of solar cells 10 includes a light-receiving surface to which sunlight enters and a back surface provided on the opposite side of the light-receiving surface. The light-receiving surface and the back surface are main surfaces in each of a plurality of solar cells 10. An electrode is formed on the light-receiving surface and on the back surface of each of a plurality of solar cells 10.

The wiring member 20 is a wiring member for electrically connecting a plurality of solar cells 10 one another. In particular, one end of the wiring member 20 is arranged on the light-receiving surface of one solar cell 10 along an arrangement direction and the other end of the wiring member 20 is arranged on the back surface of another solar cell 10 along the arrangement direction. Accordingly, the longitudinal direction of the wiring member 20 corresponds to the arrangement direction. The wiring member 20 is connected to the main surface of the solar cell 10 by the adhesive 30. The wiring member 20 is preferably constituted by a material with low electrical resistance, such as thin plate-shaped or twisted-shaped copper, silver, gold, tin, nickel, aluminum or alloys thereof. Note that a surface of the wiring member 20 may be covered with a conductive material, such as lead free solder (for example, $SnAg_{3.0}Cu_{0.5}$).

The adhesive 30 is formed between the main surfaces (the light-receiving surface and the back surface) of the solar cell 10 and the wiring member 20. As the adhesive 30, in addition to generally used solder, a resin adhesive can be used. If the resin adhesive is used as the adhesive 30, a thermosetting resin adhesive, such as acrylic resin and polyurethane-based resin adhesive with high flexibility, as well as a two-component adhesive in which a curing agent is mixed to epoxy resin, acrylic resin or urethane resin can be used for example. Note that in the present embodiment, the adhesive 30 protrudes from between the solar cell 10 and the wiring member 20.

If a resin adhesive is used as the adhesive 30, the resin adhesive 30 may contain a particulate conductive material (not illustrated), such as nickel and gold-coated nickel. An example of the resin adhesive containing such a conductive material is anisotropic conductive adhesive. The content of the conductive material may preferably be that several conductive materials are arranged along the thickness direction after the resin adhesive is cured. With this, electrical resistance along the thickness direction can be reduced.

If an insulating resin adhesive is used as the adhesive 30, the wiring member 20 and the solar cell 10 are electrically connected by letting a surface of the wiring member 20 adhere directly to a surface of the electrode of the solar cell 10. If a resin adhesive containing a conductive material is used as the adhesive 30, the wiring member 20 and the solar cell 10 are electrically connected via the conductive material. Also in this case, it is possible to let the surface of the wiring member 20 adhere directly to the surface of the electrode of the solar cell 10.

The light-receiving-surface-side protection member 2 is disposed on the light-receiving surface side of each of a plurality of solar cells 10 and protects a surface of the solar cell module 100. As the light-receiving-surface-side protection member 2, light-transmissive and water-shielding glass, light-transmissive plastic or the like can be used.

The back-surface-side protection member 3 is disposed on the back surface side of each of a plurality of solar cells 10 and protects the back surface of the solar cell module 100. As the back-surface-side protection member 3, a resin film, such as PET (Polyethylene Terephthalate), a laminated film having a structure in which Al foil is sandwiched by the resin films, or the like can be used.

The sealing material 4 seals the solar cell string 1 between the light-receiving-surface-side protection member 2 and the back-surface-side protection member 3. As the sealing material 4, light-transmissive resin, such as EVA, EEA, PVB, silicon, urethane, acrylics and epoxy, can be used.

Note that an Al frame or the like can be attached to an outer circumference of the solar cell module 100 having the above-described structure.

(Structure of Solar Cell String)

Figure 2:
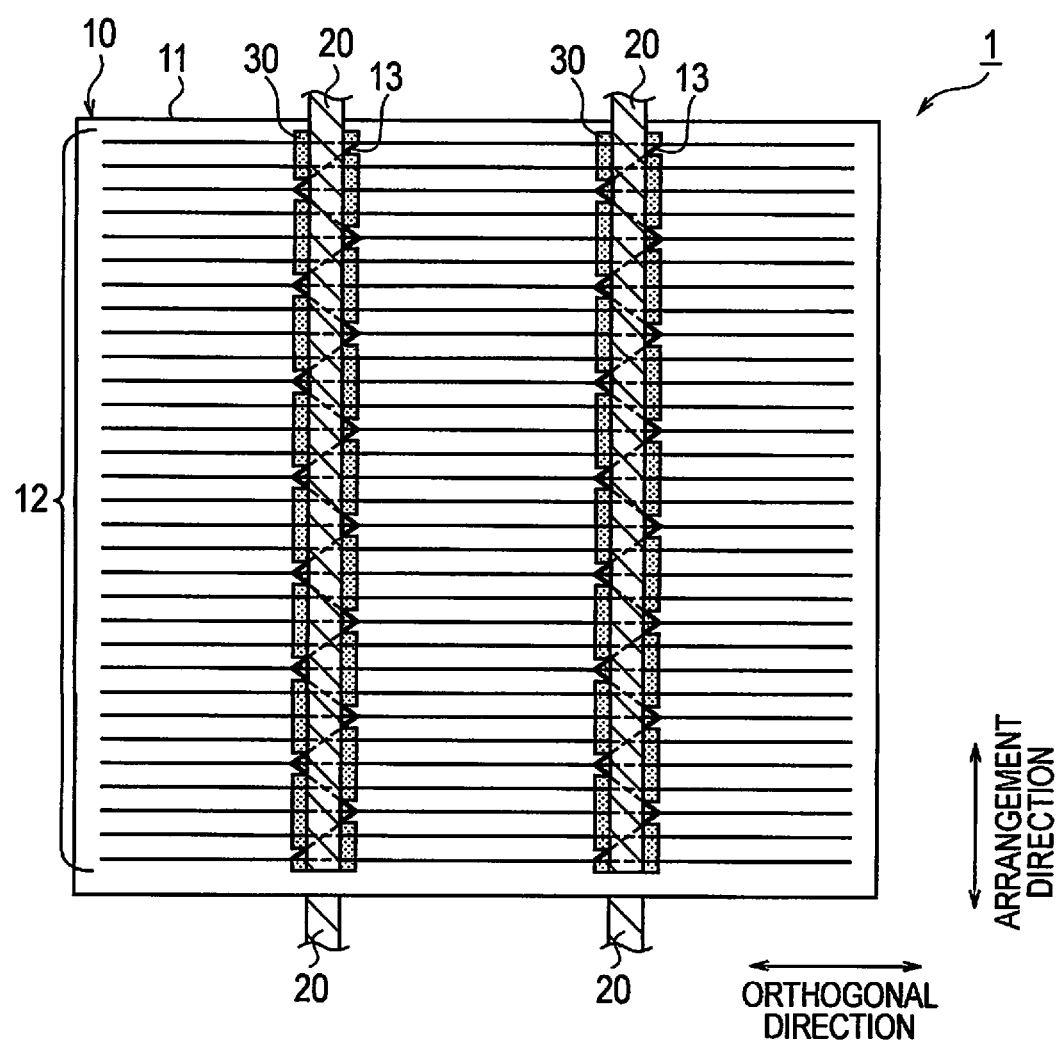
FIG. 2 is an enlarged plan view of a solar cell string 1 according to the first embodiment of the present invention seen from a light-receiving surface side.
Figure 3:
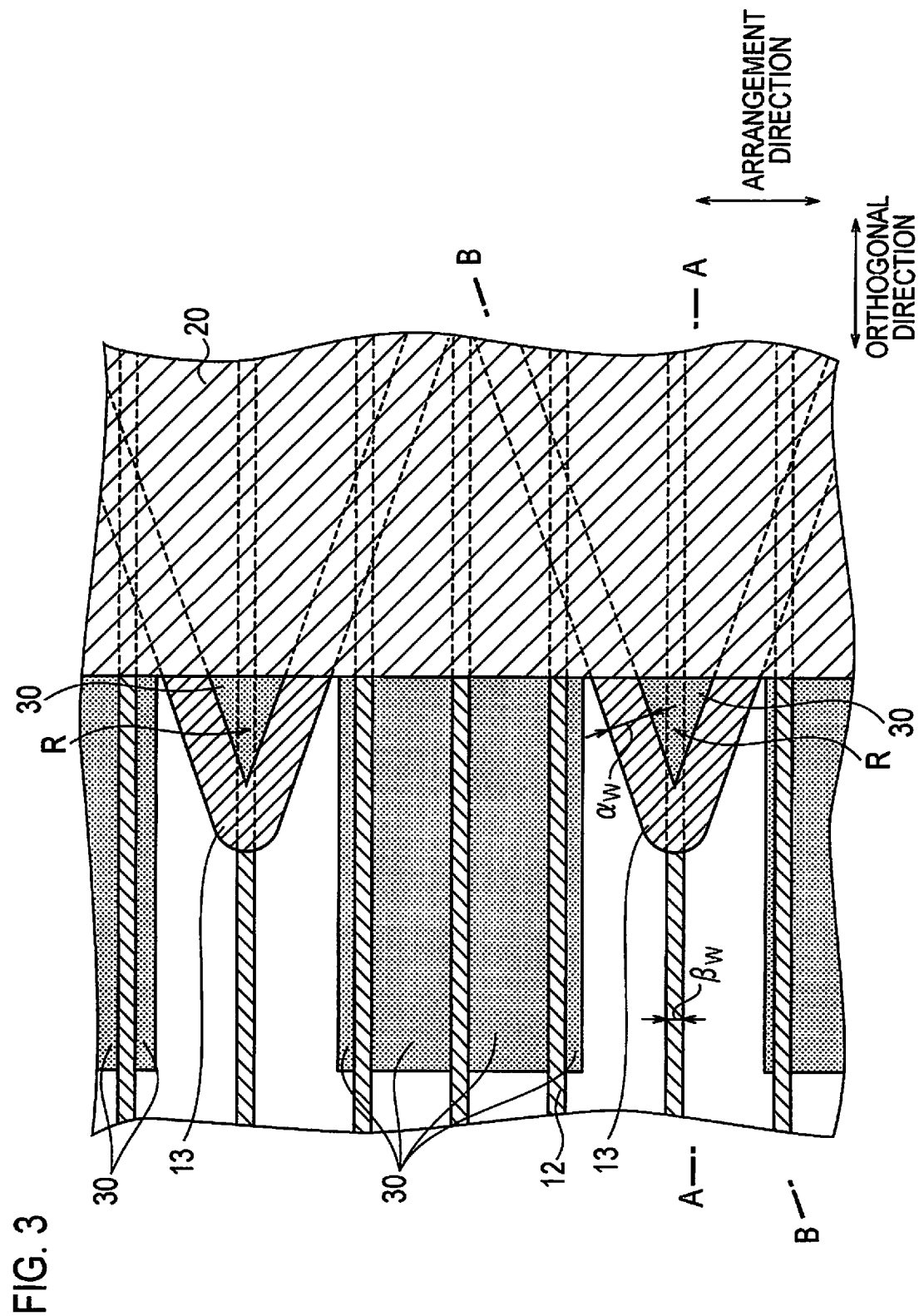
FIG. 3 is a partially enlarged view of FIG. 2.

Next, the structure of the solar cell string 1 according to the first embodiment will be described with reference to the drawings. FIG. 2 is an enlarged plan view of the solar cell string 1 according to the first embodiment seen from the light-receiving surface side. FIG. 3 is a partially enlarged view of FIG. 2.

The solar cell string 1 is provided with the wiring member 20 arranged on the light-receiving surface of the solar cell 10 as illustrated in FIG. 2. A portion of the adhesive 30 which protrudes from between the solar cell 10 and the wiring member 20 is exposed to the light-receiving surface of the solar cell 10.

The solar cell 10 includes a photovoltaic converting unit 11, a plurality of thin line electrodes 12 and a cross electrode 13, as illustrated in FIG. 2.

The photovoltaic converting unit 11 produces a photogenerated carrier when received light. The photogenerated carrier refers to a pair of positive hole and electron. The photovoltaic converting unit 11 includes, for example, an n-type region and a p-type region thereinside and a semiconductor junction for carrier separation is formed at an interface of the n-type region and the p-type region. The photovoltaic converting unit 11 can be formed using a semiconductor substrate constituted by a crystal semiconductor material, such as single crystal Si and polycrystalline Si, a compound semiconductor material, such as GaAs and InP, or the like. Note that the photovoltaic converting unit 11 may have a structure in which characteristics of a heterojunction interface are improved by inserting a genuine amorphous silicon layer between the single crystal silicon substrate and the amorphous silicon layer, which is called the "HIT" (registered trademark; SANYO Electric Co., Ltd.) structure.

A plurality of thin line electrodes 12 are electrodes which collect the carriers from the photovoltaic converting unit 11. Each of a plurality of thin line electrodes 12 are formed linearly on the light-receiving surface along an orthogonal direction which is perpendicular to the arrangement direction substantially. A plurality of thin line electrodes 12 are arranged in parallel with one another at predetermined intervals along the arrangement direction. Accordingly, in the present embodiment, the arrangement direction along which a plurality of thin line electrodes 12 are arranged in parallel with one another corresponds to the arrangement direction along which a plurality of solar cells 10 are arranged in series.

On the light-receiving surface, the cross electrode 13 crosses a plurality of thin line electrodes 12. The cross electrode 13 is an electrode which collects the carriers from a plurality of thin line electrodes 12. In the present embodiment, the cross electrode 13 is formed in a zigzag shape along the arrangement direction, as illustrated in FIG. 2. On the cross electrode 13, the wiring member 20 is arranged. Although not illustrated, the centerline of the cross electrode 13 substantially corresponds to the centerline of the wiring member 20.

Here, as illustrated in FIG. 3, the line width $\alpha_w$ of the cross electrode 13 is greater than the line width $\beta_w$ of the thin line electrode 12 which crosses the cross electrode 13. With this, the resistance loss by the cross electrode 13 can be reduced. The line width $\alpha_w$ of the cross electrode 13 is smaller than the line width of the wiring member 20. With this, it is possible to suppress occurrence of bending or the like in the photovoltaic converting unit 11 due to heat applied during formation of the cross electrode 13 which is caused by the difference in coefficient of linear expansion between the cross electrode 13 and the photovoltaic converting unit 11.

As illustrated in FIG. 3, the solar cell 10 includes a plurality of pooling portions R. Each of a plurality of pooling portions R is a portion which pools the adhesive 30. Each of a plurality of pooling portions R is a region surrounded by the cross electrode 13 and the wiring member 20 on the light-receiving surface. Accordingly, a plurality of pooling portions R are formed near the wiring member 20 on the light-receiving surface of the solar cell 10. In the present embodiment, a plurality of pooling portions R are formed on both orthogonal direction (i.e., the lateral direction of the wiring member 20) sides. A plurality of pooling portions R are formed in a distributed manner along the arrangement direction (i.e., the longitudinal direction of the wiring member 20).

Note that the planar shape of each of a plurality of pooling portions R is triangular in the present embodiment but this is not restrictive. For example, the planar shape of each of a plurality of pooling portions R may be trapezoidal, semicircular or the like.

Figure 4:
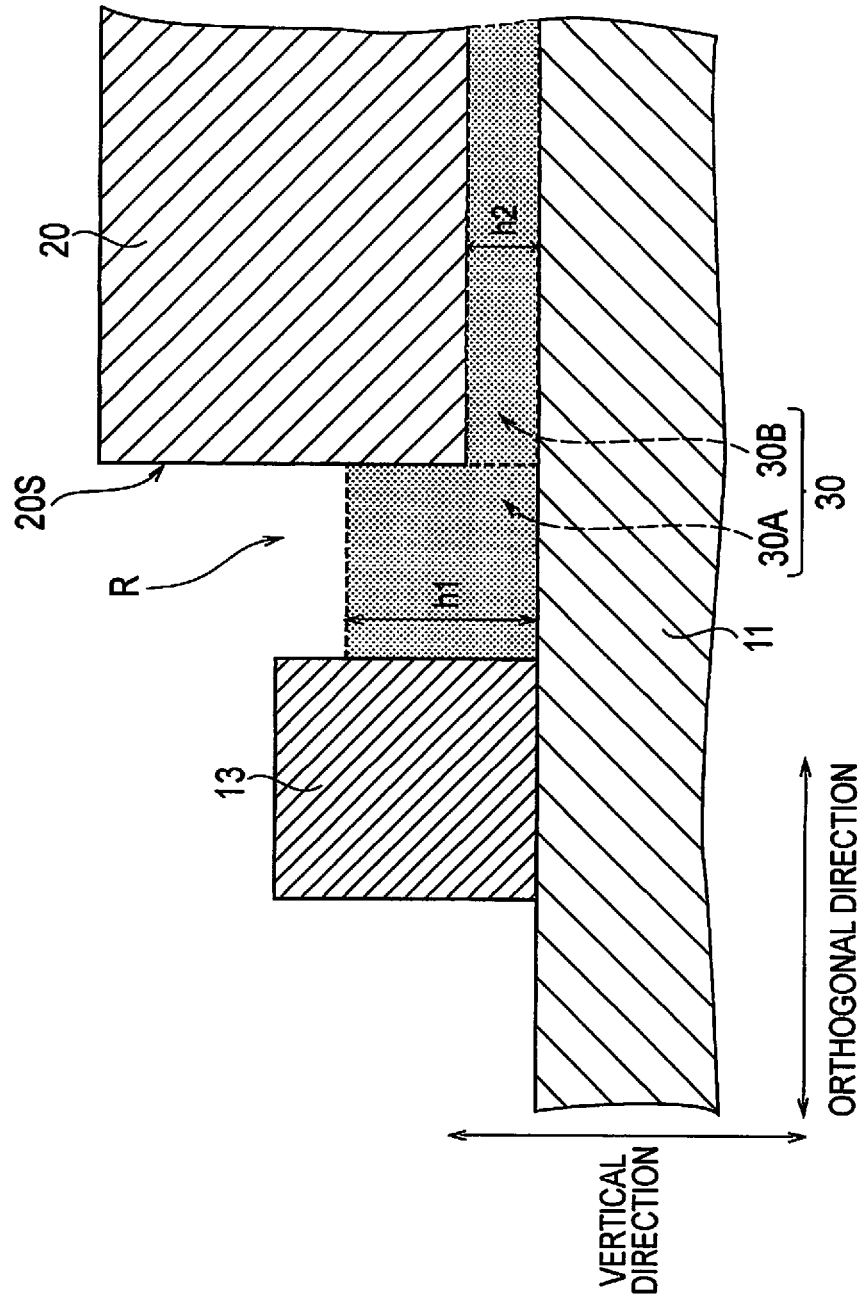
FIG. 4 is a sectional view along line A-A of FIG. 3.

FIG. 4 is a sectional view along line A-A of FIG. 3. As illustrated in FIG. 4, the adhesive 30 includes a first adhesive portion 30A and a second adhesive portion 30B.

The first adhesive portion 30A is formed from the light-receiving surface of the solar cell 10 to a side surface 20S of the wiring member 20. The first adhesive portion 30A is pooled in each of a plurality of pooling portions R. As described above, since a plurality of pooling portions R are distributed along the longitudinal direction of the wiring member 20, a plurality of first adhesive portions 30A are arranged in a distributed manner along the longitudinal direction on the light-receiving surface of the solar cell 10.

Such a first adhesive portion 30A is formed by damming up, by the cross electrode 13, the adhesive 30 protruding from between the wiring member 20 and the solar cell 10 when the wiring member 20 is pressed against the solar cell 10. Therefore, in the pooling portion R, the bulk of the adhesive 30 becomes large to reach the side surface 20S of the wiring member 20. With this, the first adhesive portion 30A is formed from the main surface of the solar cell 10 to the side surface 20S of the wiring member 20. Therefore, the adhesive strength of the wiring member 20 can be increased.

The second adhesive portion 30B is formed between the wiring member 20 and the solar cell 10. The first adhesive portion 30A and the second adhesive portion 30B are formed integrally with one another. Therefore, the adhesive 30 can be easily made to adhere to the side surface 20S of the wiring member 20 without any increase in manufacturing steps.

As illustrated in FIG. 4, in the vertical direction which is the direction vertical to the light-receiving surface, the height h1 of the first adhesive portion 30A is greater than the height h2 of the second adhesive portion 30B. Therefore, since an area in which the adhesive 30 adheres to the side surface 20S of the wiring member 20 can be increased, the adhesive strength of the wiring member 20 can be increased.

In a case in which resin containing a conductive material (not illustrated) is used as the adhesive 30, a part of the conductive material is in direct contact with the surface of the wiring member 20 and the surface of the thin line electrode 12. Accordingly, the area in which the first adhesive portion 30A adheres to the side surface 20S of the wiring member 20 can be increased by letting the height h1 of the first adhesive portion 30A be greater than the height of the conductive material. As a result, the adhesive strength of the wiring member 20 can be increased.

Figure 5:
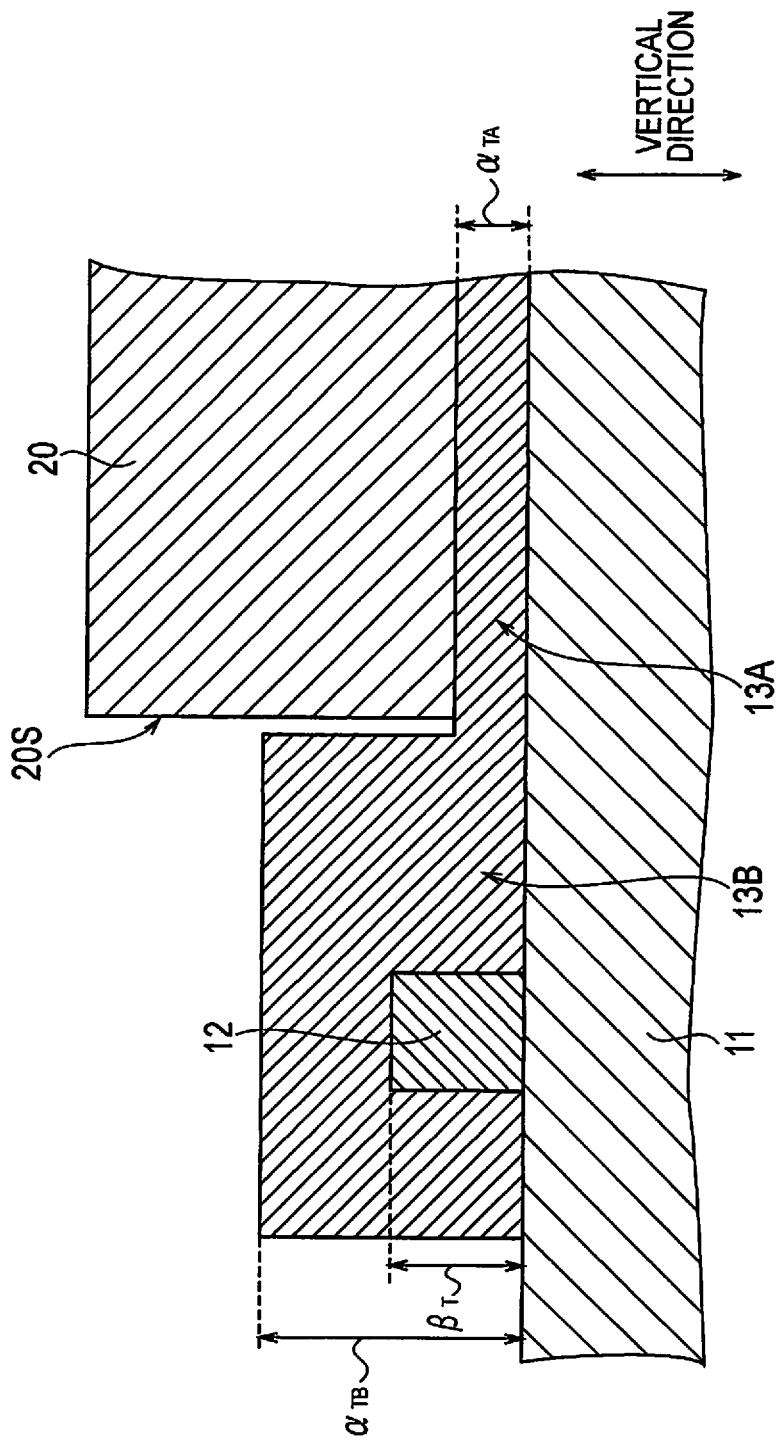
FIG. 5 is a sectional view along line B-B of FIG. 3.

FIG. 5 is a sectional view along line B-B of FIG. 3. As illustrated in FIG. 5, when the solar cell 10 is seen from the light-receiving surface side, the cross electrode 13 includes a covered portion 13A covered with the wiring member 20 and an exposed portion 13B exposed from the wiring member 20.

Here, in the vertical direction, the height $\alpha_{TA}$ of the covered portion 13A is smaller than the height $\alpha_{TB}$ of the exposed portion 13B. In the vertical direction, the height $\alpha_{TB}$ of the exposed portion 13B is greater than the height $\beta_T$ of the thin line electrode 12 which crosses the cross electrode 13.

However, the height $\alpha_{TA}$ of the covered portion 13A, the height $\alpha_{TB}$ of the exposed portion 13B and the height $\beta_T$ of the thin line electrode 12 may be substantially the same as one another.

Note that, although not illustrated, a plurality of thin line electrodes and a cross electrode are formed on the back surface of the solar cell 10 side as illustrated in FIG. 2. However, the present invention is not restrictive regarding the electrode pattern on the back surface side of the solar cell 10. For example, thin line electrodes which is greater in number than a plurality of thin line electrodes 12 formed on the light-receiving surface may be formed on the back surface of the solar cell 10, and an entire-surface electrode may be formed on the back surface of the solar cell 10 instead of a plurality of thin line electrodes.

(Manufacturing Method of Solar Cell Module)

Next, a manufacturing method of the solar cell module 100 according to the present embodiment will be described.

(1) Solar Cell Formation Process

First, a photovoltaic converting unit 11 is prepared.

Next, a conductive paste, such as an epoxy-based thermosetting silver paste, is printed on the light-receiving surface of the photovoltaic converting unit 11 using a printing method, such as screen printing and offset printing. A printing pattern in this case is, for example, an electrode pattern illustrated in FIG. 2. The height of the exposed portion 13B of the cross electrode 13 can be increased by applying the conductive paste repeatedly and locally.

Next, a conductive paste, such as an epoxy-based thermosetting silver paste, is printed on the back surface of the photovoltaic converting unit 11 using a printing method, such as screen printing and offset printing. Although the printing pattern in this case is, for example, the electrode pattern illustrating in FIG. 2, this is not restrictive.

Next, a plurality of thin line electrodes 12 and the cross electrode 13 are formed by drying the printed conductive paste under a predetermined condition. With this, the solar cell 10 is produced.

(2) Solar Cell String Formation Process

Next, a plurality of solar cells 10 are arranged along the arrangement direction and, at the same time, a plurality of solar cells 10 are connected with one another via the wiring member 20.

In particular, first, one wiring member 20 is arranged on the light-receiving surface of the solar cell 10 via a tape-shaped or paste-state adhesive 30 constituted by an anisotropic conductive adhesive and, at the same time, another wiring member 20 is arranged on the back surface of the solar cell 10 via the similar adhesive 30. Next, one wiring member 20 is heated while being pressed against the light-receiving surface side and, at the same time, another wiring member 20 is heated while being pressed against the back surface side. With this, a part of the softened adhesive 30 protrudes seen from between the solar cell 10 and the wiring member 20 and is pooled in each of a plurality of pooling portions R. Then, by further heating the adhesive 30, the adhesive 30 is cured and each of one wiring member 20 and another wiring member 20 is made to adhere to the solar cell 10. Note that the connection of one wiring member 20 and another wiring member 20 may be performed simultaneously or separately.

(3) Modularization Process Step

Next, on a glass substrate (the light-receiving-surface-side protection member 2), an EVA (the sealing material 4) sheet, the solar cell string 1, an EVA (the sealing material 4) sheet and a PET sheet (the back-surface-side protection member 3) are laminated successively to form a laminated product.

Next, the EVA is cured by heating the above-described laminated product under a predetermined condition.

In this manner, the solar cell module 100 is produced. A terminal box, an Al frame or the like can be attached to the solar cell module 100.

(Operation and Effect)

In the solar cell module 100 according to the first embodiment, the adhesive 30 includes the first adhesive portion 30A formed from the light-receiving surface of the solar cell 10 to the side surface 20S of the wiring member 20.

Accordingly, since it is possible to increase the adhesive strength of the wiring member 20, the adhesion between the wiring member 20 and the solar cell 10 can be kept. As a result, it is possible to suppress degradation in characteristics of the solar cell module 100.

A plurality of first adhesive portions 30A is distributed along the longitudinal direction of the wiring member 20. Here, since all the elasticity of the wiring member is transmitted to the solar cell 10 in a case in which the entire side surface 20S of the wiring member 20 adheres to the solar cell 10 via the adhesive 30, there is a possibility that the adhesive 30 and the solar cell 10 are destroyed. In the present embodiment, since a plurality of first adhesive portions 30A are distributed as described above, it is possible to avoid that all the elasticity of the wiring member 20 is transmitted to the solar cell 10. As a result, since damage to the adhesive 30 and to the solar cell 10 can be reduced, it is possible to further suppress degradation of characteristics of the solar cell module 100.

In the first embodiment, the height $\alpha_{TB}$ of the cross electrode 13 is greater than the height $\beta_T$ of the thin line electrode 12 which crosses the cross electrode 13. Accordingly, the portion of the adhesive 30 protruding from between the wiring member 20 and the solar cell 10 can be effectively pressed back to the wiring member 20 side.

In the cross electrode 13 according to the first embodiment, the height $\alpha_{T\!A}$ of the covered portion 13A is smaller than the height $\alpha_{T\!B}$ of the exposed portion 13B. Thus, since the distance between the wiring member 20 and the solar cell 10 can be shortened by reducing the height $\alpha_{T\!A}$ of the covered portion 13A, it becomes easy to let the adhesive 30 protrude from between the wiring member 20 and the solar cell 10. Further, the electrical resistance of the cross electrode 13 can be reduced by increasing the height $\alpha_{T\!B}$ of the exposed portion 13B.

[Second Embodiment]

Figure 6:
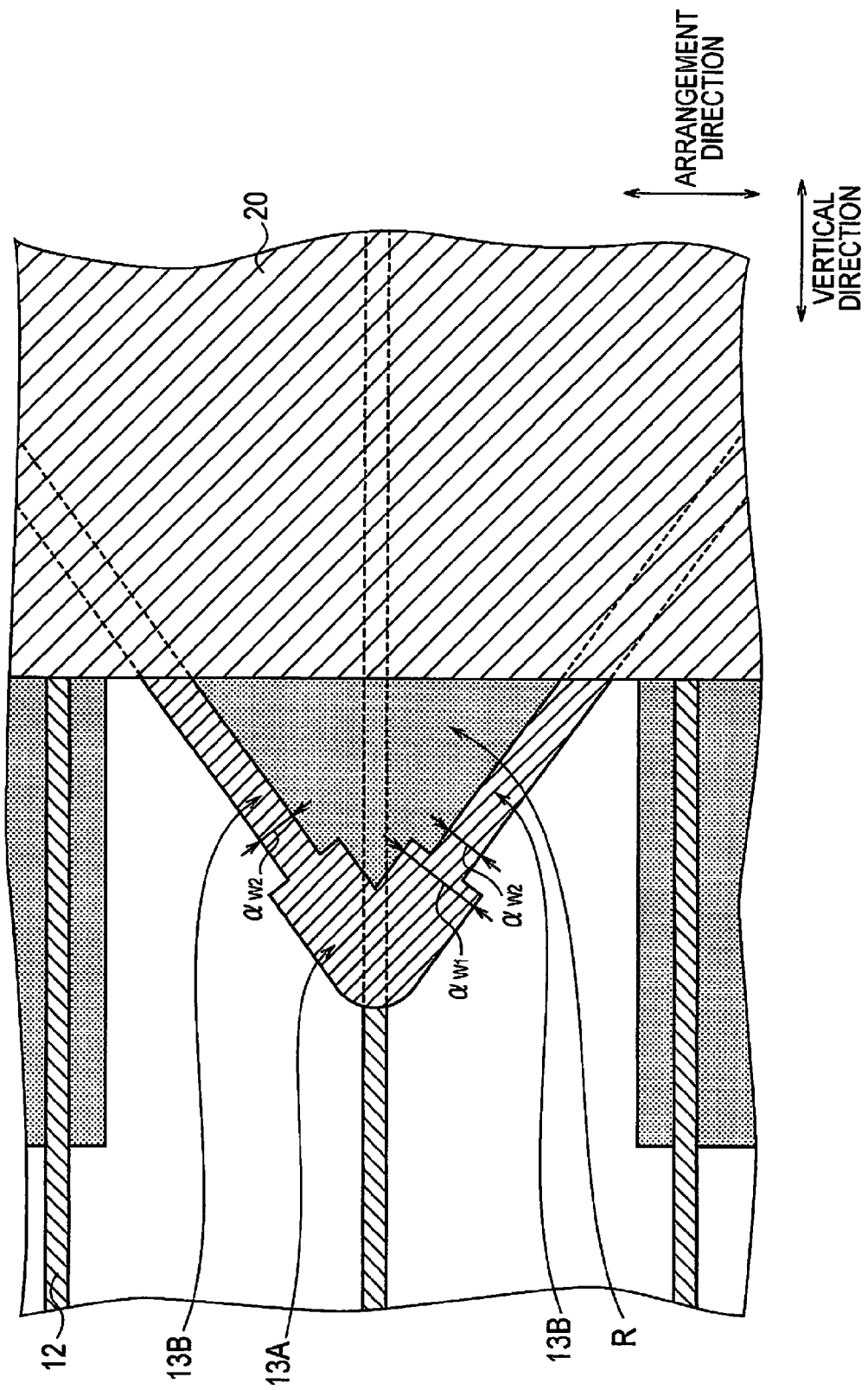
FIG. 6 is an enlarged plan view of a solar cell string 1 according to a second embodiment of the present invention seen from a light-receiving surface side.

Hereinafter, a solar cell string 1 according to a second embodiment of the present invention will be described with reference to the drawings. FIG. 6 is an enlarged plan view of the solar cell string 1 according to the second embodiment seen from the light-receiving surface side.

As illustrated in FIG. 6, a cross electrode 13 includes a crossing portion 13a which is a portion crossing one thin line electrode 12 of a plurality of thin line electrodes 12, and an extending portion 13b extending from the crossing portion 13a. The line width $\alpha_{w1}$ of the crossing portion 13a is greater than the line width $\alpha_{w2}$ of the extending portion 13b. That is, the cross electrode 13 is formed to increase in the line width at the portion in which the cross electrode 13 crosses each of a plurality of thin line electrodes 12.

Although the crossing portion 13a is provided at a bending portion of the cross electrode 13 in FIG. 6, this is not restrictive. In a case in which a linear portion of the cross electrode 13 and the thin line electrode 12 cross one another, the crossing portion 13a is provided at the linear portion of the cross electrode 13.

Although the crossing portion 13a is provided in the exposed portion 13B (not illustrated in FIG. 6) of the cross electrode 13 in FIG. 6, this is not restrictive. The crossing portion 13a may be provided in the covered portion 13A of the cross electrode 13.

(Operation and Effect)

In the cross electrode 13 according to the second embodiment, the line width $\alpha_{w1}$ of the crossing portion 13a is greater than the line width $\alpha_{w2}$ of the extending portion 13b.

Thus, the connecting strength between the cross electrode 13 and the thin line electrode 12 can be increased by forming a greater line width $\alpha_{w1}$ of the crossing portion 13a. Accordingly, it is possible to suppress disconnection between the cross electrode 13 and the thin line electrode 12 in response to the expansion and contraction of the wiring member 20 in the usage environment of the solar cell module 100. It is also possible to suppress reduction in the light-receiving surface of the solar cell 10 since the line width $\alpha_{w2}$ of the extending portion 13b is narrowed. As a result, it is possible to suppress that the characteristics of solar cell module 100.

(Other Embodiments)

Although the present invention has been described with reference to the above-described embodiment, it should not be understood that the discussion and the drawings which constitute a part of the present invention is restrictive to the invention. Various alternatives, examples and operational techniques will be clear to a person skilled in the art from this disclosure.

Figure 7:
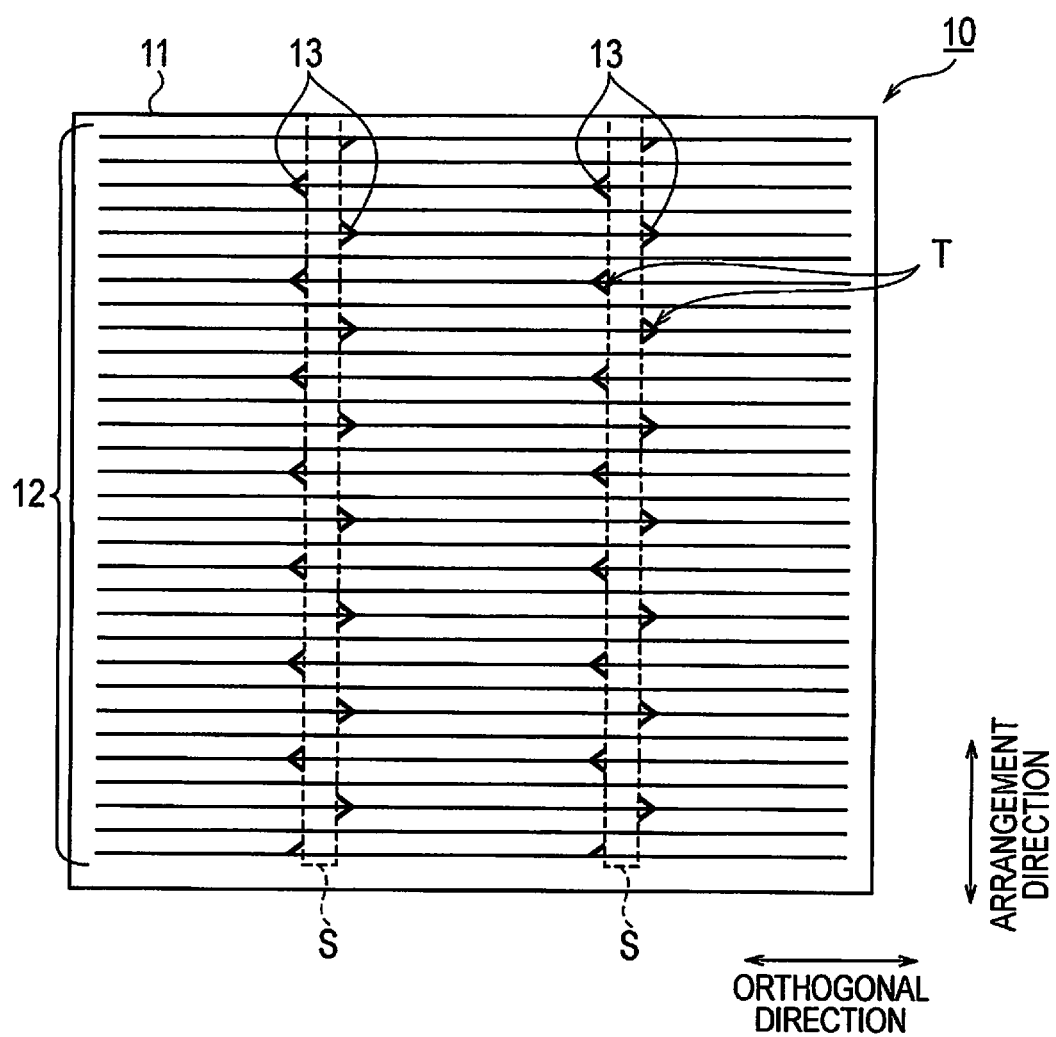
FIG. 7 is a plan view of a solar cell 10 according to an embodiment of the present invention.
Figure 8:
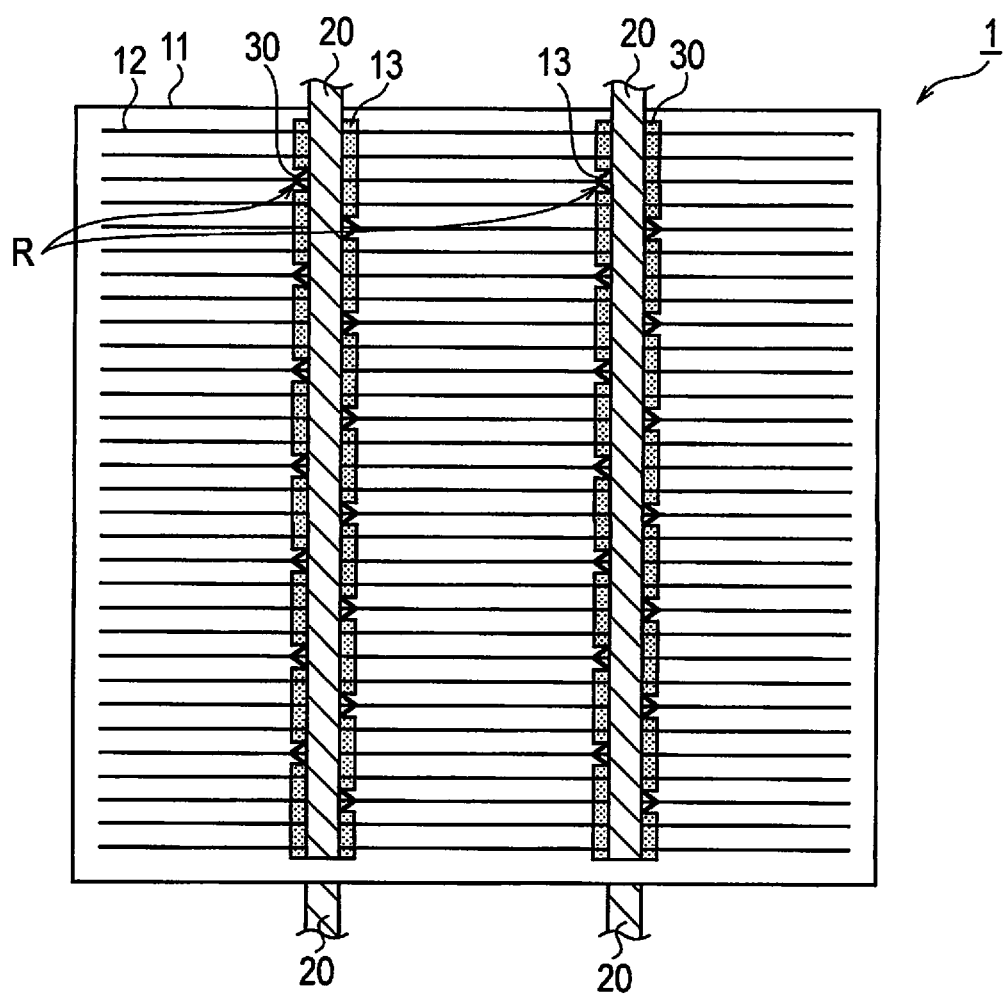
FIG. 8 is a plan view of a solar cell string 1 according to an embodiment of the present invention.

For example, although the cross electrode 13 is formed in a zigzag shape along the arrangement direction on the light-receiving surface in the above-described embodiment, this is not restrictive. Although the cross electrode 13 includes the covered portion 13A and the exposed portion 13B, this is not restrictive. As illustrated in FIG. 7, the solar cell 10 may include a plurality of cross electrodes 13. Each of a plurality of cross electrodes 13 illustrated in FIG. 7 corresponds to the exposed portion 13B according to the embodiment described above. Each of a plurality of cross electrodes 13 forms a protrusion region T which is a region protruding outward from a region S on the light-receiving surface in which the wiring member 20 is arranged. Even in a case in which the solar cell string 1 is produced using such a solar cell 10, the adhesive 30 can be collected in the pooling portion R formed corresponding to the protruding region T as illustrated in FIG. 8. Although a case in which the solar cell 10 includes a plurality of cross electrodes 13 is illustrated in FIG. 7, it suffices that the solar cell 10 includes at least one cross electrode 13 illustrated in FIG. 7.

Figure 9:
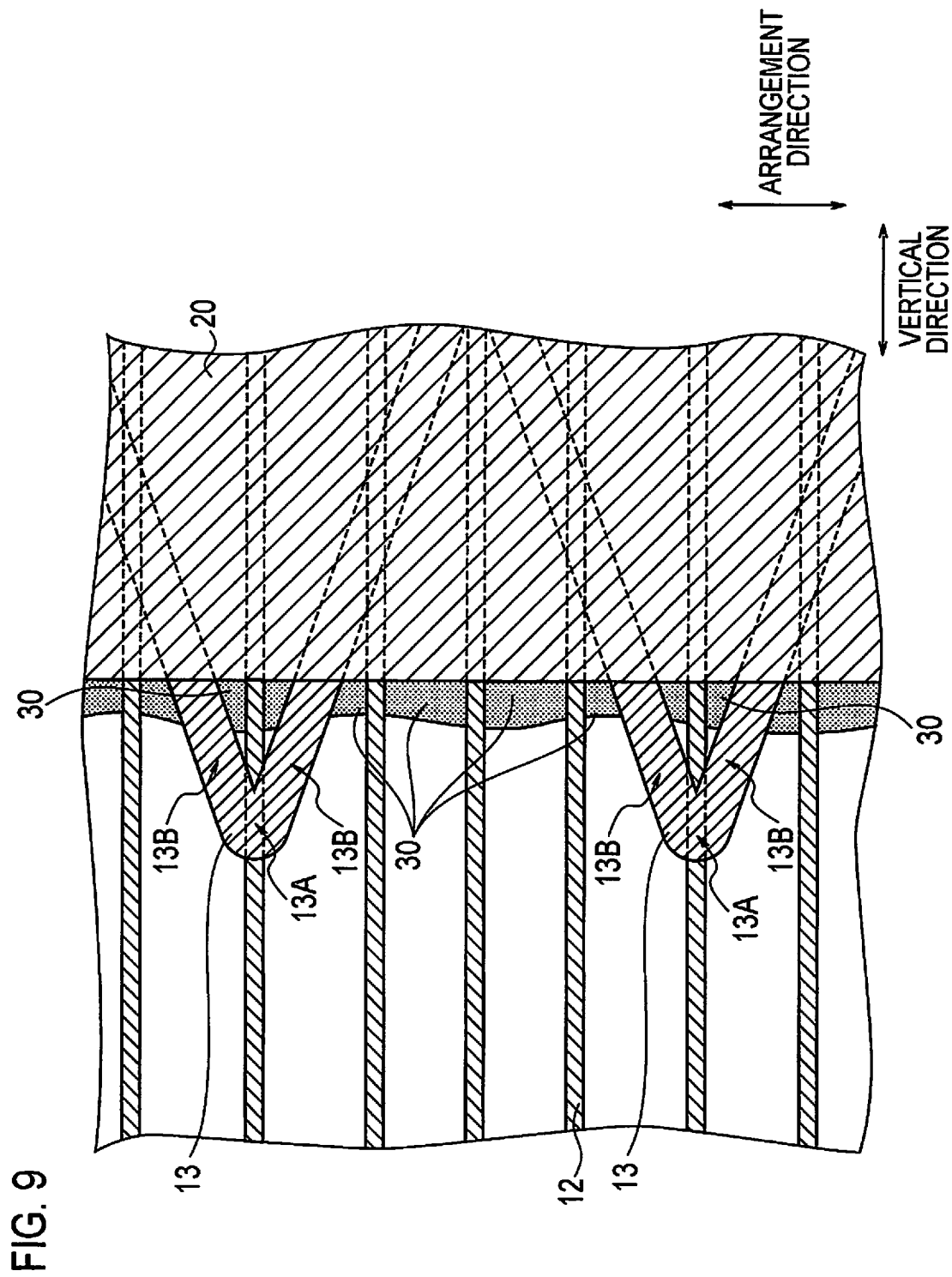
FIG. 9 is a partially enlarged plan view of a solar cell string according to another embodiment of the present invention seen from a light-receiving surface side.

Although the solar cell 10 includes the pooling portion R in the above-described embodiment, this is not always necessary. As illustrated in FIG. 9, the solar cell 1 may need not include the pooling portion R. FIG. 9 is a partially enlarged plan view of the solar cell string according to another embodiment of the present invention seen from the light-receiving surface side. An orthogonal direction end of the protruding adhesive 30 is spaced apart from the crossing portion 13a in a plan view from the side of the main surface. That is, the orthogonal direction end of the adhesive 30 is not in contact with the crossing portion 13a in the plan view described above. Accordingly, the main surface of the solar cell 10 is exposed to the region surrounded by the cross electrode 13 and the wiring member 20 in the plan view described above. Even in such a case, the adhesive 30 protruding from between the solar cell 10 and the wiring member 20 can obtain the similar effect as that of the above-described embodiment if it includes the first adhesive portion 30A. Since the usage amount of the adhesive can be suppressed, the cost can be reduced.

Further, even in a case in which the solar cell 1 includes no pooling portion R, the adhesive 30 may include the second adhesive portion 30B. Although the thin line electrode 12 is not covered with the adhesive 30 in both orthogonal direction sides of the wiring member 20, the thin line electrode 12 may be covered with the adhesive 30.

Although a case in which a plurality of thin line electrodes 12 and the cross electrode 13 are formed on the light-receiving surface of the solar cell 10 has been described mainly in the above-described embodiment, a plurality of thin line electrodes 12 and the cross electrode 13 may be formed on the back surface of the solar cell 10.

In addition, although each of a plurality of thin line electrodes 12 is formed along the orthogonal direction which is substantially perpendicular to the arrangement direction (the longitudinal direction of the wiring member 20) in the above-described embodiment, this is not restrictive. It suffices that each of a plurality of thin line electrodes 12 is formed along the direction which crosses the arrangement direction (the longitudinal direction of the wiring member 20).

Although not particularly mentioned in the above-described embodiment, each of a plurality of thin line electrodes 12 and the cross electrode 13 may bury itself in the wiring member 20 or may need not bury itself in the wiring member 20. In a case in which each of a plurality of thin line electrodes 12 and the cross electrode 13 buries itself in the wiring member 20, the adhesive 30 may need not have conductivity. In a case in which each of a plurality of thin line electrodes 12 and the cross electrode 13 does not bury itself in the wiring member 20, it is preferred that the adhesive 30 has conductivity.

As described above, it is of course that the present invention includes various embodiments or the like that are not described herein. Accordingly, the technical scope of the present invention is defined only by the matter to define the invention related to the claims that is reasonable from the above description.

EXAMPLES

The solar cell module according to the present invention will be specifically described below with reference to the examples. However, the present invention is not limited to those described in the following examples, and can be implemented with alternations made as appropriate within the scope of the invention.

Example 1

First, a plurality of photovoltaic converting units (125 mm in square and 200 micrometers in thickness) having a structure which is called the "HIT" (registered trademark; SANYO Electric Co., Ltd.) structure were prepared.

Next, a plurality of thin line electrodes (line width: 100 micrometers, pitch: 2 mm) and the cross electrode (line width: 120 micrometers, orthogonal direction width: 2 mm) were formed by printing a silver paste once by means of offset printing on the light-receiving surface of each of a plurality of photovoltaic converting units. A formed pattern of the electrode was the pattern illustrated in FIG. 2. Subsequently, the conductive paste on the light-receiving surface was dried under a predetermined condition.

Next, a plurality of thin line electrodes (line width of 100 micrometers, pitch of 1 mm) and cross electrode (line width of 120 micrometers, and orthogonal direction 2 mm in width) were formed by printing silver paste once with offset printing on back surface of each a plurality of photovoltaic converting units. A formed pattern of the electrode was the pattern illustrated in FIG. 2. With this, a plurality of solar cells are formed. Subsequently, the conductive paste on the back surface was dried under a predetermined condition.

Next, a plurality of solar cells were connected to one another using a wiring member (line width; 1.5 mm). In particular, the wiring member was arranged on thermosetting epoxy resin applied on the light-receiving surface and the back surface of each solar cell by means of a dispenser, and the wiring member was heated and attached to the solar cell with pressure. With this, a solar cell string was formed.

Next, a glass substrate, an EVA sheet, a solar cell string, an EVA sheet and a PET/aluminum foil/PET lamination film were laminated successively.

In the first example, the height of a portion formed outside a region of the cross electrode in which the wiring member is arranged (i.e., the exposed portion) was 50 micrometers.

Example 2

In Example 2, the height of a portion formed outside a region of the cross electrode in which the wiring member is arranged (i.e., the exposed portion) was increased. In particular, the silver paste was printed twice in the exposed portion of the cross electrode. On the other hand, in a portion formed inside a region of the cross electrode in which the wiring member is arranged (i.e., the covering portion), the silver paste was printed only once as described above. Other processes were the same as those of Example 1.

In Example 2, the height of the exposed portion was 65 micrometers.

Example 3

In Example 3, the silver paste was printed three times in the exposed portion of the cross electrode. Other processes were the same as those of Example 1.

In Example 3, the height of the exposed portion was 70 micrometers.

Example 4

In Example 4, the silver paste was printed four times in the exposed portion of the cross electrode. Other processes were the same as those of Example 1.

In Example 4, the height of the exposed portion was 75 micrometers.

Comparative Example

No cross electrode was formed in Comparative example. Other processes were the same as those of Example 1.
(Tension Test of Wiring Member)

Regarding Examples 1 to 4 and Comparative example, adhesive strength of the wiring member was measured by a tension test in which the wiring member was pulled in the vertical direction.

Adhesive strength (g) of the wiring member according to Examples 1 to 4 and Comparative example is shown in the table below.

TABLE 1

|  | Adhesive strength (g) |
| --- | --- |
| Example 1 | 140 |
| Example 2 | 155 |
| Example 3 | 175 |
| Example 4 | 175 |
| Comparative example | 120 |

As shown in the table above, in Examples 1 to 4, it was possible to increase adhesive strength as compared with Comparative example. This is because the wiring member was made to adhere to the solar cell successfully by collecting the resin adhesive in the pooling portion formed between the cross electrode and the wiring member.
(Temperature Cycling Test)

Regarding Examples 1 to 4 and Comparative example, a rate of degrease in output of the solar cell module after a temperature cycling test (JIS C8917) was compared. In the temperature cycling test, 200 cycles were successively performed with a temperature change from high (90 degrees C.) to low (−40 degrees C.) or from low to high being one cycle conforming to JIS standard. The solar cell module was irradiated with light on condition of AM 1.5, 100 mW/cm$_2$.

The rates of degrease in output (%) after the temperature cycling test of the solar cell module according to Examples 1 to 4 and Comparative example are shown in the table below.

TABLE 2

|  | Rate of degrease in output (%) |
| --- | --- |
| Example 1 | 4.3 |
| Example 2 | 3.8 |
| Example 3 | 3.6 |
| Example 4 | 3.6 |
| Comparative example | 4.9 |

As shown in the table above, in Examples 1 to 4, it was possible to reduce the rate of degrease in output as compared with Comparative example. This is because, as described above, since it was possible to let the wiring member adhere to the solar cell successfully, adhesion of the wiring member was kept.

As described above, it was confirmed that adhesive strength of the wiring member was increased and that degradation in characteristics of the solar cell module can be suppressed by means of forming the pooling portion by the cross electrode and the wiring member.

The entire content of Japanese Patent Application No. 2009-103160 (filed on Apr. 21, 2009) is incorporated to the specification of the present application by reference.

Industrial Applicability

As described above, the solar cell module according to the present invention are useful in the field of manufacturing a solar cell module since degradation in characteristics can be suppressed.

1 . . . solar cell string, 2 . . . light-receiving-surface-side protection member, 3 . . . back-surface-side protection member, 4 . . . sealing material, 10 . . . solar cell, 11 . . . photovoltaic converting unit, 12 . . . thin line electrode, 13 . . . cross electrode, 13A . . . , covered portion, 13B . . . , exposed portion, 20 . . . wiring member, 20S . . . side surface, 100 . . . solar cell module, R . . . pooling portion

The invention claimed is:

1. A solar cell module which includes a solar cell and a wiring member connected to a main surface of the solar cell by an adhesive, wherein the adhesive includes:

a plurality of first adhesive portions each formed from the main surface to a side surface of the wiring member; and a second adhesive portion continuous with the first adhesive portion and provided between the solar cell and the wiring member, wherein the plurality of first adhesive portions are distributed along a longitudinal direction of the wiring member, the solar cell includes, adjacent the wiring member on the main surface, a plurality of pooling portions corresponding to a collection region for collecting each of the plurality of first adhesive portions, each of the plurality of pooling portions is bordered on one side by the wiring member and bordered on an opposite side by at least one edge of an electrode with respect to an orthogonal direction of the main surface of the solar cell, and the electrode is a cross electrode that forms a zigzag pattern along the longitudinal direction of the wiring member.

2. The solar cell module according to claim 1, wherein the first portion and the second portion are integral and made of a common material.

3. The solar cell module according to claim 1, further comprising thin line electrodes perpendicular to the wiring member and wherein the width of the cross electrode is greater than the widths of the thin line electrodes.

4. The solar cell module according to claim 1, wherein the each of the plurality of pooling portions as seen from above the plane of the solar cell module is in the shape of a triangle with an apex extending out from the wiring member.

5. A solar cell module comprising:

a solar cell comprising an electrode on a main surface of the solar cell;

a wiring member connected to the main surface of the solar cell by an adhesive including a plurality of first adhesive portions each formed from the main surface to a side surface of the wiring member, wherein the solar cell includes a plurality of pooling portions wherein each of the plurality of pooling portions corresponds to a collection region for collecting each of the plurality of first adhesive portions, each of the plurality of pooling portions is bordered on one side by the wiring member and bordered on an opposite side by at least one edge of the electrode with respect to an orthogonal direction of the main surface of the solar cell, the plurality of pooling portions are distributed along a longitudinal direction of the wiring member, and the electrode is a cross electrode that forms a zigzag pattern along the longitudinal direction of the wiring member.

6. The solar cell module according to claim 5, further comprising thin line electrodes perpendicular to the wiring member and wherein the width of the cross electrode is greater than the widths of the thin line electrodes.

7. The solar cell module according to claim 5, wherein the each of the plurality of pooling portions as seen from above the plane of the solar cell module is in the shape of a triangle with an apex extending out from the wiring member.

* * * * *